United States Patent

Scoones et al.

[11] Patent Number: 5,977,815
[45] Date of Patent: Nov. 2, 1999

[54] INTEGRATED CMOS CIRCUIT

[75] Inventors: Kevin Scoones, Moosburg; Guenter Heinecke, Langenbach; Erich Bayer, Piflas, all of Germany

[73] Assignee: Texas Instruments Deutschland, GmbH, Freising, Germany

[21] Appl. No.: 09/066,305

[22] PCT Filed: Oct. 28, 1996

[86] PCT No.: PCT/EP96/04686

§ 371 Date: Apr. 27, 1998

§ 102(e) Date: Apr. 27, 1998

[87] PCT Pub. No.: WO97/15952

PCT Pub. Date: May 1, 1997

[30] Foreign Application Priority Data

Oct. 27, 1995 [DE] Germany ............... 195 40 169

[51] Int. Cl.$^6$ ........................................... G05F 1/10
[52] U.S. Cl. ..................... 327/530; 327/545; 361/88; 365/228
[58] Field of Search ..................... 327/142, 143, 327/530, 545, 546; 361/5, 90, 91, 92, 88; 365/226, 228, 229

[56] References Cited

U.S. PATENT DOCUMENTS

| | | | |
|---|---|---|---|
| 4,791,317 | 12/1988 | Winnerl et al. | 307/296 |
| 4,952,998 | 8/1990 | Ludikhuize | 357/42 |
| 5,212,616 | 5/1993 | Dhong et al. | 361/18 |
| 5,619,165 | 4/1997 | Fournel et al. | 327/546 |
| 5,761,144 | 6/1998 | Fukuzumi | 365/228 |
| 5,901,096 | 5/1999 | Inokuchi et al. | 365/228 |

FOREIGN PATENT DOCUMENTS

| | | |
|---|---|---|
| 3839077 | 6/1989 | Germany . |
| 63-118848 | 5/1988 | Japan . |

*Primary Examiner*—Jung Ho Kim
*Attorney, Agent, or Firm*—Baker & Botts, L.L.P.

[57] ABSTRACT

A CMOS circuit (10), which is integrated in a semiconductor substrate, comprises a principal circuit part (12), which includes the major part of the circuit components in a well isolated from the substrate by a substrate diode. The CMOS circuit furthermore comprises a power output stage (16) driving an inductive load (26, 28). A sensor (18) is connected with one output (22, 24) of the power output stage (16) and on detection of a voltage biasing the substrate diode (30, 32) in the conducting direction produces a switching signal at the output. On occurrence of the switching signal produced by the sensor (18) a controllable switch (20) disconnects the supply voltage from the principal circuit part (12). In its own separate well (46) a status memory (14) is formed on the substrate adjacent to the principal circuit part (12), such status memory (14) comprising memory elements for storage of status data of the principal circuit part (12) on disconnection of the supply voltage.

3 Claims, 2 Drawing Sheets

INTEGRATED CMOS CIRCUIT

The invention relates to a CMOS circuit integrated in a semiconductor substrate comprising a principal circuit part, which contains the major part of the circuit elements in a well isolated from the substrate by a substrate diode, with a power output stage for driving an inductive load.

It is known that the so-called latch-up effect can occur in integrated CMOS circuits, which means that a parasitic thyristor structure, inherent in the design of the circuit, is fired by a current flowing through the substrate diode in the forward direction and accordingly changes into the conducting state, which can not be reversed without turning off the operating voltage. In particular firing of such thyristor structure is caused if the inductive load supplied by the CMOS circuit is turned off and the counter-EMF produced during such turning off operation results in there being a current flowing in the forward direction of the substrate diode. This current will fire the parasitic thyristor so that even after decay of the current caused by the inductive load a current will still flow through this thyristor from the supply terminal to ground. This latch-up effect is for example described in the book "Electronic und Microelectronic" by D. Sautter and H. Weinerth published by VDI Verlag 1993, page 559. Up till the present attempts have been focussed on preventing the occurrence of the latch-up effect with the aid of process related measures. Such process-related measures do however lead to an undesired increase in the surface area requirement of the circuit on its semiconductor chip. This additional area can however only be made available by the use of a larger chip, which leads to higher costs.

U.S. Pat. No. 5,212,616 discloses a latch-up protection circuit which prevents damage to a CMOS integrated circuit chip having internal circuitry due to transient surges or internal-circuitry initiated latch-ups. The latch-up protection circuit is integrated with an on-chip voltage regulation circuit which provides on-chip power to the internal chip circuitry. The on-chip voltage supplied to internal chip circuitry is compared by detection circuitry with a reference voltage signal representative of the occurrence of a latch-up condition, i.e., with the nominal external power supply. When the on-chip power supply voltage becomes lower than the trigger voltage, then a power transistor and the voltage regulation circuit are disabled by the detection circuitry, thereby reducing the latch-up condition.

In Patent Abstracts of Japan, vol. 12, no. 368 (P-766) (JP 63118848) a resetting circuit for abnormal case (e.g. latch-up state) of a microcomputer is described. After detecting a latch-up state the resetting circuit turns off a switch for a fixed period of time to stop the supply of power to the microcomputer, to the circuits associated with the microcomputer, and to a nonvolatile memory which is connected to the microcomputer. The data obtained before the microcomputer becomes abnormal can be extracted out of the nonvolatile memory.

U.S. Pat. No. 4,952,998 describes an integrated CMOS circuit having a transistor located in a p (or an n) well and an adjacent complementary transistor. The transistors are located in an epitaxial layer on a highly doped substrate. A "latch-up" can be avoided by providing under the source zone of the transistor located beside the well a second region having substantially the same doping and depth as the well, which is connected to the source zone.

One object of the invention is to provide an integrated CMOS circuit of the type initially mentioned, in which the latch-up effect is prevented with the aid of circuit-related measures.

In accordance with the invention this object is achieved by a CMOS circuit integrated in a semiconductor substrate comprising a principal circuit part, which contains the major part of the circuit elements in a well isolated from the substrate, and a power output stage driving an inductive load, characterized by a sensor connected to the output of the power output stage, which produces a switching signal when it detects at the output a voltage biasing the substrate diode in the forward direction, a controllable switch, which on the occurence of the switching signal produced by the sensor disconnects the power voltage from the principal circuit part and a status memory, formed adjacent to the principal circuit part in its own well on the substrate, such status memory having elements for storage of status data of the principal circuit part on such disconnection of the supply voltage.

When in the integrated CMOS circuit in accordance with the invention owing to an operation turning off the inductive load a current is produced flowing through the substrate diode, which may lead to the latch-up effect by firing of a parasitic thyristor, the supply voltage of the principal part of the integrated circuit is disconnected by the output signal produced by the sensor so that any thyristor which have possibly been turned on is returned to the non-conducting state. It is in this manner that the latch-up effect is successfully prevented. In order to ensure that when the circuit is re-started the same circuit condition occurs as before turning off the supply voltage, the supply voltage to the status memory is not disconnected so that it may store the necessary state data which are required for further operation. By means of such state data the circuit may then further function when put into operation.

The invention will now be described with reference to the accompanying drawings by way of example.

Figure 1:
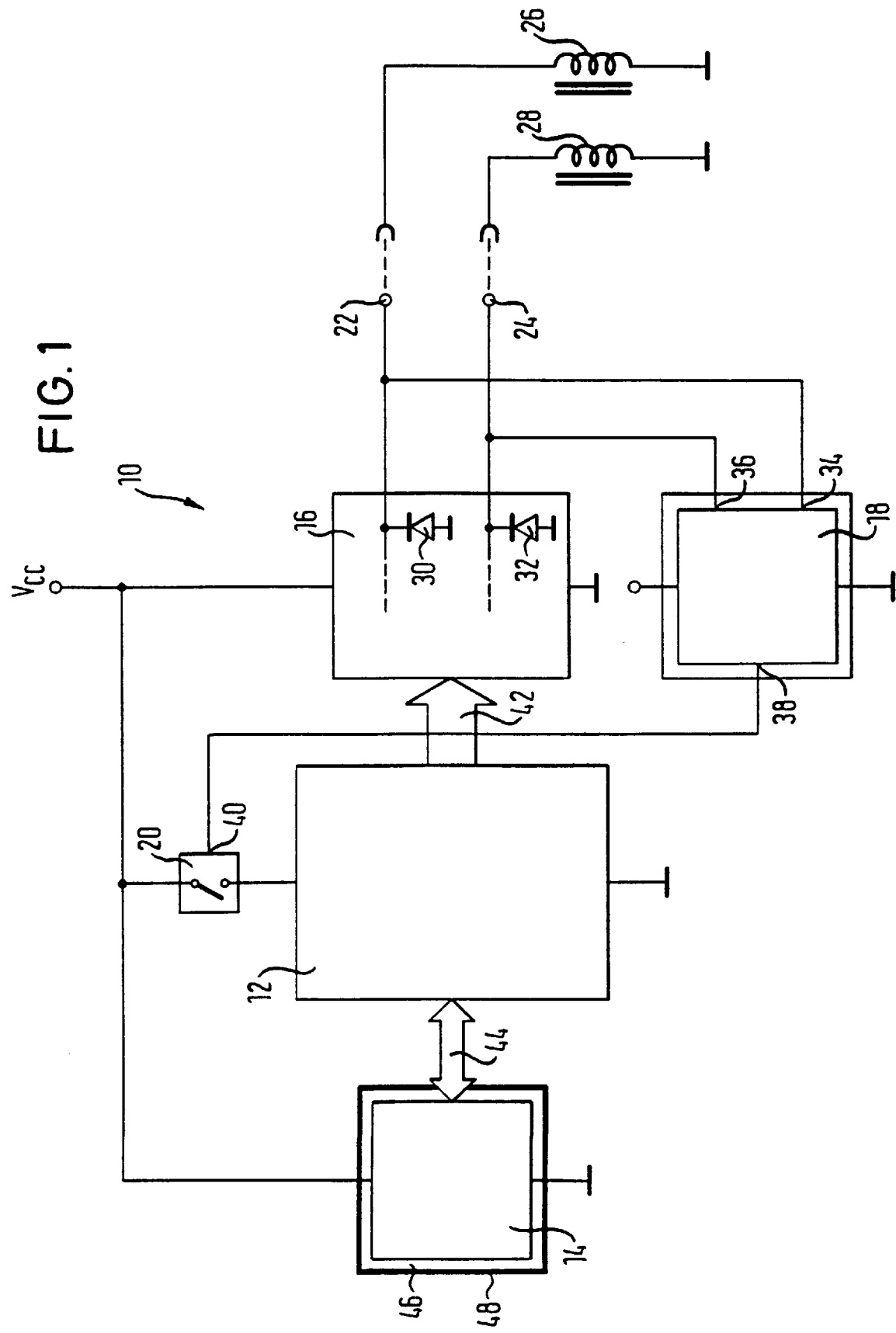
FIG. 1 shows a block circuit diagram of an integrated CMOS circuit in accordance with the invention.
Figure 2:
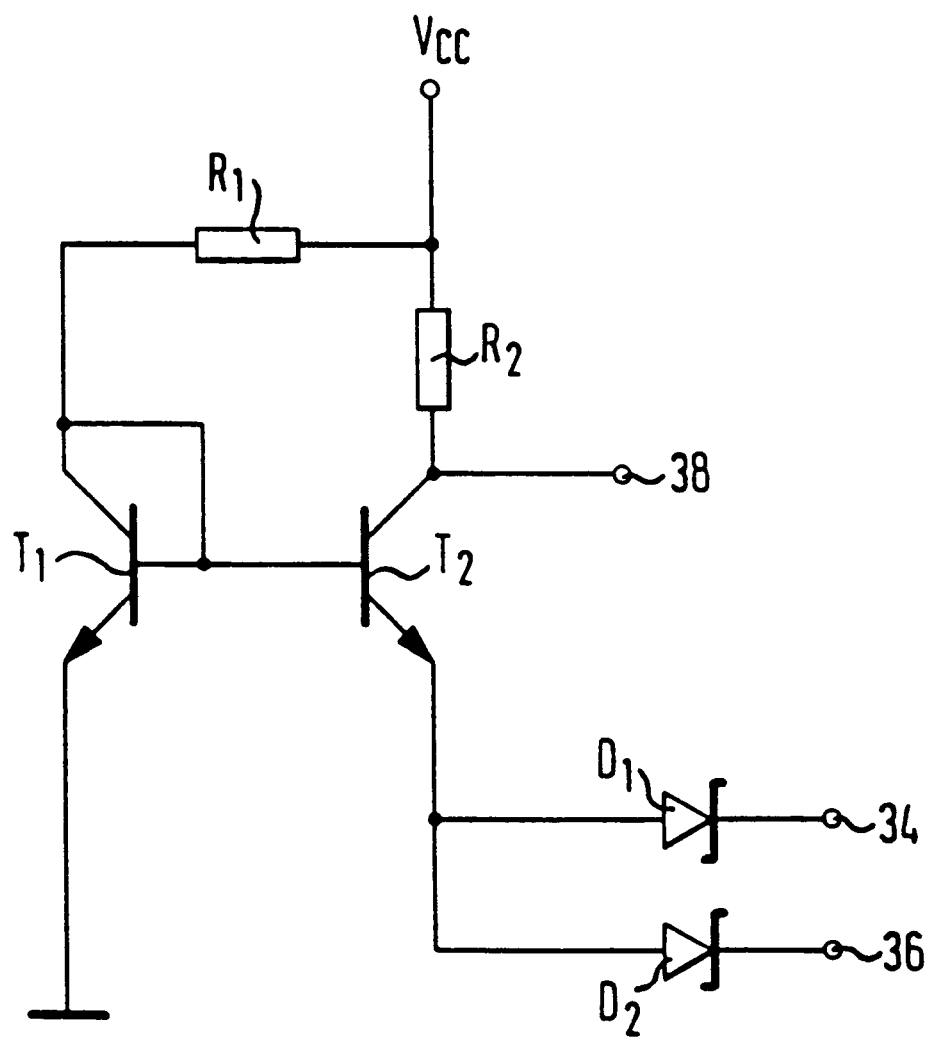
FIG. 2 shows an example of a sensor for use in the circuit of FIG. 1.

The circuit of figure is an integrated CMOS circuit 10, which comprises a principal circuit part 12, a status memory 14 and a power output stage 16. Furthermore the CMOS circuit comprises a sensor 18 and a switch 20, with the aid of which the principal circuit part 12 may be disconnected from the supply voltage Vcc.

The CMOS circuit 10 of FIG. 1 serves to drive an inductive load, which is connected with the terminals 22 and 24. In FIG. 1 this inductive load is illustrated in the form of two coils 26 and 28, which may for example be motor windings.

In order to render the invention comprehensible, in the power output stage 16 only two diodes 30 and 32 are shown, which are the substrate diodes, that is to say pn junctions, which exist between the well, in which the remaining elements of the power output stage 16 and of the principal circuit part 12 are placed, and the semiconductor substrate.

As shown in FIG. 1, the sensor 18 possesses two inputs 34 and 36, which are connected with the outputs 22 and 24, respectively, of the CMOS circuit 10. One output 38 of the sensor 18 is connected with the control output 40 of the switch 20. The principal circuit part 12 comprises the CMOS components with the aid of which the power output stage is controlled via the connection 42. Signals produced in the course of control of the power output stage 16, which each define particular circuit states, are respectively held in the status memory 14, which will be, dependent on the particular application, individual flipflops or also a bank of several individually controlled memory stages. The transfer of the status data between the principal circuit part 12 and the status memory 14 is performed via the connection 44.

During operation the circuit of FIG. 1 performs as follows:

Let it be assumed that the power transistors comprised in the power output stage 16 supply current to the coils 26 and 28 constituting the inductive load. In a following operational stage such current is now to be turned off. This is performed by turning off the power transistors, not illustrated, comprised in the power output stage 16, this being something familiar to the man in the art so that no further explanations are required on this point. Switching off the current flowing through the coils 26 and 28 means that a counter-EMF is produced at such coils which causes a voltage to occur at the outputs 22 and 24 able to put the substrate diodes 30 and 32 in the turned on state.

However this current flowing through the substrate diodes means in turn that a parasitic thyristor structure present in the CMOS circuit of the principal circuit part 12 fires, that is to say changes into the conductive state. Owing to the known characteristic of the thyristor structure it is now no longer possible for the conductive state of the thyristor structure to be terminated by disconnection of the current causing firing. The hold current of the thyristor structure, that is to say the current necessary for maintaining the conductive state, is in fact substantially less than the current, which caused firing to take place. The thyristor structure will only change back into the non-conductive state, when the supply voltage is turned off.

When at one of its inputs 34 and 36, which are connected with the outputs 22 and, respectively, 24, the sensor 18 detects a voltage capable of putting the substrate diodes 30 and/or 32 into the conductive state, this will mean that at the output 38 are switching signal will appear, which puts the switch 20 in the open condition. The principal circuit part 12 is consequently disconnected from the supply voltage $V_{cc}$ so that one may be sure that any parasitic thyristor structure, which has already fired, will change back into the turned off state. The status memory 14 on the contrary will remain connected with the supply voltage $V_{cc}$ so that the status data stored in it will continue to be available. The switching signal will be applied to the switch 20 as long as a substrate diode turn on voltage is present at the inputs 34 and/or 36. Since this voltage is produced by switching off the inductive loads 26 and 28, it will decay in accordance with an e-function and will accordingly only be effective for a limited period of time. As soon as this voltage is no longer sufficient to bias the substrate diodes in the conducting direction, the switch 20 is closed again, since the output 38 of the sensor 18 will then no longer supply the switching signal. The principal circuit part 12 is then again quite ready for operation and it will now immediately have the status data available to it, which are stored in the status memory 14.

In order to prevent any parasitic thyristor present in the status memory 14 changing into the conducting state, the well 46 containing this status memory is arranged at a maximum distance from the power output stage 16 on the substrate comprising the entire integrated circuit. Furthermore it is possible for the status memory to be surrounded by a protective ring, as is generally conventional for mutually isolating zone regions on a substrate.

Owing to the measures as described supra it is possible to securely prevent the latch-up effect with a small space requirement on the surface of the semiconductor substrate. Prevention by the use of process-related measures, as for example the arrangement of the principal circuit part in its own EPI zone, would require substantially more aera on the substrate surface so that a larger semiconductor chip would have to be employed, something leading to higher costs.

We claim:

1. In a CMOS circuit integrated in a semiconductor substrate comprising a principal circuit part, the principal circuit part having most of its circuit elements in a well isolated from the substrate by a substrate diode, and a power output stage driving an inductive load, the improvement comprising:

a sensor connected to the output of the power output stage, which produces a switching signal when it detects at the output a voltage biasing the substrate diode in the forward direction, a controllable switch, which on the occurrence of the switching signal produced by the sensor disconnects a power supply voltage from the principal circuit part, and a status memory formed adjacent to the principal circuit part in its own well on the substrate, the status memory having elements for storage of status data of the principal part on said disconnection of the supply voltage.

2. The integrated CMOS circuit as claimed in claim 1, wherein the well including the status memory is arranged on the substrate at a maximum possible distance on the substrate from the power output stage, wherein the substrate comprises the entire CMOS circuit.

3. The integrated CMOS circuit as claimed in claim 1, wherein the status memory is surrounded by a protective ring.

* * * * *